(12) United States Patent
Sun et al.

(10) Patent No.: US 12,237,030 B2
(45) Date of Patent: Feb. 25, 2025

(54) LAYOUT OF DRIVING CIRCUIT, SEMICONDUCTOR STRUCTURE AND SEMICONDUCTOR MEMORY

(71) Applicant: CHANGXIN MEMORY TECHNOLOGIES, INC., Hefei (CN)

(72) Inventors: Huijuan Sun, Hefei (CN); Jihoon Lee, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 227 days.

(21) Appl. No.: 18/162,811

(22) Filed: Feb. 1, 2023

(65) Prior Publication Data

US 2023/0178164 A1    Jun. 8, 2023

Related U.S. Application Data

(63) Continuation of application No. PCT/CN2021/131909, filed on Nov. 19, 2021.

(30) Foreign Application Priority Data

Sep. 1, 2021   (CN) .......................... 202111022398.5

(51) Int. Cl.
    *G11C 29/10*   (2006.01)
(52) U.S. Cl.
    CPC .................................. *G11C 29/10* (2013.01)
(58) Field of Classification Search
    CPC ........................................................... G11C 29/10
    USPC ......................................................... 365/201
    See application file for complete search history.

(56) References Cited

U.S. PATENT DOCUMENTS

| | | | |
|---|---|---|---|
| 6,310,815 B1* | 10/2001 | Yamagata | G11C 5/14 365/230.03 |
| 6,339,235 B1* | 1/2002 | Takata | G06F 1/10 257/777 |
| 6,823,485 B1 | 11/2004 | Muranaka | |
| 7,158,439 B2 | 1/2007 | Shionoiri | |
| 7,977,974 B2 | 7/2011 | Onishi | |
| 8,294,485 B2 | 10/2012 | Ouyang | |
| 10,026,661 B2 | 7/2018 | Won | |
| 2005/0047266 A1 | 3/2005 | Shionoiri | |
| 2005/0283671 A1* | 12/2005 | Stave | G11C 29/1201 714/31 |
| 2007/0076515 A1 | 4/2007 | Shionoiri | |
| 2008/0201586 A1 | 8/2008 | Onishi | |
| 2010/0201376 A1 | 8/2010 | Ouyang | |
| 2016/0086863 A1 | 3/2016 | Won | |

FOREIGN PATENT DOCUMENTS

| | | |
|---|---|---|
| CN | 1581358 A | 2/2005 |
| CN | 101252292 A | 8/2008 |
| CN | 206672103 U | 11/2017 |
| CN | 109903712 A | 6/2019 |

* cited by examiner

*Primary Examiner* — Anthan Tran
(74) *Attorney, Agent, or Firm* — Syncoda LLC; Feng Ma

(57) ABSTRACT

A layout of a driving circuit, a semiconductor structure and a semiconductor memory are provided. The layout includes P-type transistors, N-type transistors and four test modules. The four test modules are distributed on both sides of the P-type transistors and the N-type transistors in an upper-lower symmetrical structure, and the P-type transistors and the N-type transistors have an upper-lower structure distribution in the middle of the four test modules.

20 Claims, 7 Drawing Sheets

LAYOUT OF DRIVING CIRCUIT, SEMICONDUCTOR STRUCTURE AND SEMICONDUCTOR MEMORY

CROSS-REFERENCE TO RELATED APPLICATIONS

This is a continuation of International Application No. PCT/CN2021/131909, filed on Nov. 19, 2021, which claims priority to Chinese Patent Application No. 202111022398.5, filed on Sep. 1, 2021. The contents of International Application No. PCT/CN2021/131909 and Chinese Patent Application No. 202111022398.5 are hereby incorporated by reference in their entireties.

BACKGROUND

With the continuous development of semiconductor technology, integrated circuits have entered into an era of System on Chip (SOC). With the continuous reduction of process dimension, the layout design becomes more and more important.

In a Dynamic Random Access Memory (DRAM), factors are not fully considered in the existing layout and routing for the layout design of a power supply driving circuit, which not only results in a large area, but also reduces the signal matching and consistency.

SUMMARY

The present disclosure relates to the technical field of integrated circuits, and provides a layout of a driving circuit, a semiconductor structure and a semiconductor memory, which may not only improve the signal matching and consistency and reduce the influence of external factors; but also provide an overall layout with a symmetrical structure and compact arrangement, thereby achieving the purpose of saving area.

The technical solution of the present disclosure is realized as follows.

According to a first aspect, the embodiments of the present disclosure provide a layout of a driving circuit, which may include P-type transistors, N-type transistors and four test modules. The four test modules are distributed on both sides of the P-type transistors and the N-type transistors in an upper-lower symmetrical structure, and the P-type transistors and the N-type transistors have an upper-lower structure distribution in the middle of the four test modules.

According to a second aspect, the embodiments of the present disclosure provide a semiconductor structure, which includes two banks and two power supply generators. The two banks are arranged along a second direction, and the two power supply generators are respectively distributed on both sides of the two banks along a first direction.

Each power supply generator is composed of N driving circuits and an operational amplifier circuit. Each of the N driving circuits corresponds to the layout as described in the first aspect, and N is an integer greater than zero.

According to a third aspect, the embodiments of the present disclosure provide a semiconductor memory, which includes a driving circuit corresponding to the layout as described in the first aspect.

The embodiments of the disclosure provide a layout of a driving circuit, a semiconductor structure and a semiconductor memory. The layout may include P-type transistors, N-type transistors and four test modules. The four test modules are distributed on both sides of the P-type transistors and the N-type transistors in an upper-lower symmetrical structure, and the P-type transistors and the N-type transistors have an upper-lower structure distribution in the middle of the four test modules. In this way, not only the matching and consistency of signals may be improved and the influence of external factors may be reduced, but also the area may be saved since the overall layout is in a symmetrical structure and compact arrangement.

DETAILED DESCRIPTION

The technical solutions in the embodiments of the present disclosure will be clearly and completely described below in conjunction with the accompanying drawings in the embodiments of the present disclosure. It is to be understood that the specific embodiments described herein are merely intended to explain the relevant application and not to limit the application. It should also be noted that, for ease of description, only portions related to the related application are shown in the accompanying drawings.

Unless otherwise defined, all technical and scientific terms used herein have the same meaning as those generally understood by those skilled in the art belonging to the present disclosure. The terms used herein are only adopted to describe the embodiments of the disclosure and not intended to limit the disclosure.

In the following description, "some embodiments" involved describes a subset of all possible embodiments, but it is to be understood that "some embodiments" may be a same subset or different subsets of all possible embodiments and may be combined with each other without conflict.

It should be noted that the term "first\second\third" involved in the embodiments of the present disclosure is merely used to distinguish similar objects without representing a specific order for the objects. It is to be understood that "first\second\third" may be interchanged to specific sequences or orders if allowed to implement the embodiments of the disclosure described herein in sequences except the illustrated or described ones.

Figure 1:
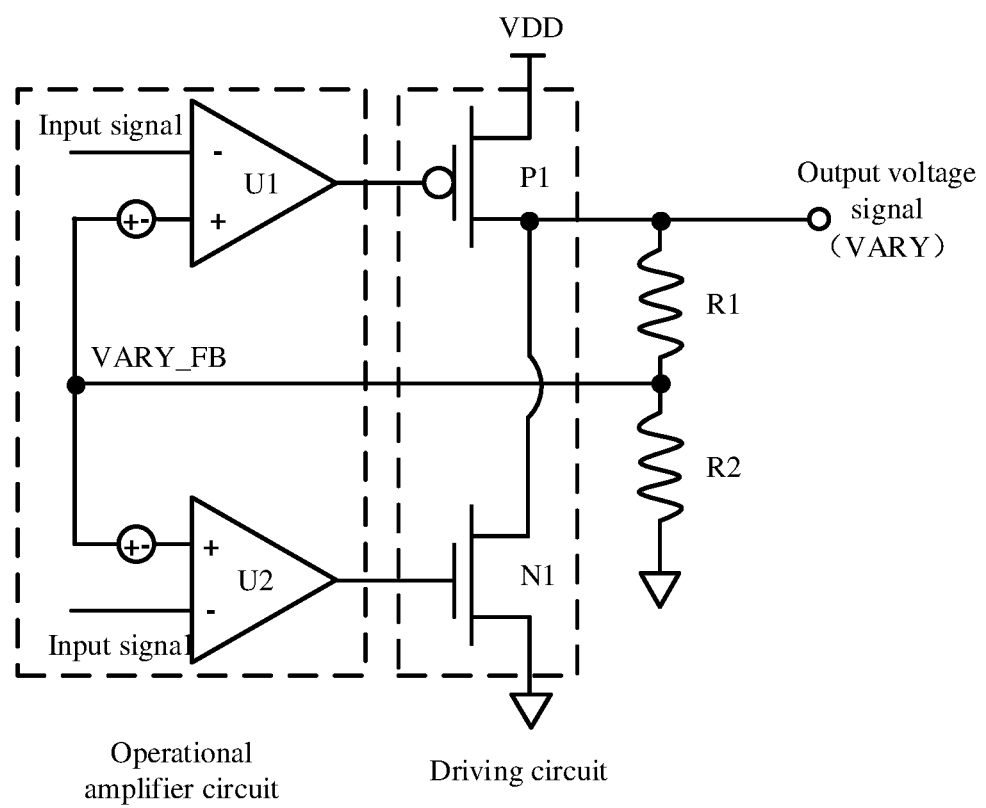
FIG. 1 is a schematic diagram of a circuit structure of a power supply generator.

Referring to FIG. 1, FIG. 1 illustrates a schematic diagram of a circuit structure of a power supply generator. As shown in FIG. 1, the circuit structure may include a power supply VDD, a first operational amplifier U1, a second operational amplifier U2, a first transistor P1 and a second transistor N1. The power supply VDD is connected to a source of the first transistor P1, an output end of the first operational amplifier U1 is connected to a gate of the first transistor P1, an output end of the second operational amplifier U2 is connected to a gate of the second transistor N1, a source of the second transistor N1 is connected to ground, a drain of the second transistor N1 is connected to a drain of the first transistor P1 and then connected to an output end, the output end is used to provide an output voltage signal (represented by VARY). A first resistor R1 and a second resistor R2 are connected in series between the output end and the ground, and the first resistor R1 is connected to the second resistor R2 to form a first connection point. A forward input end of the first operational amplifier U1 is connected to a forward input end of the second operational amplifier U2 to form a second connection point, and the first connection point is connected to the second connection point to obtain a feedback signal (represented by VARY_FB).

It is to be noted that the first resistor R1 and the second resistor R2 form a voltage divider circuit, so the resistors R1 and R2 may also be called as "voltage divider resistors". The first transistor P1 and the second transistor N1 may be Metal-Oxide-Semiconductor Field-Effect Transistors (MOSFETs), referred to as "MOS transistors" for short. Specifically, in FIG. 1, the first transistor P1 is a P-type MOS transistor and the second transistor N1 is an N-type MOS transistor. In addition, the operational amplifier is referred to as OPAMP for short. In the embodiments of the present disclosure, the operational amplifier here is a differential amplifier.

It is also to be noted that the power supply generator may also be called as a power supply generation circuit. As can be seen from FIG. 1, the core architecture of the power supply generator is "MOS transistor+operational amplifier", and the gate voltages of the MOS transistors are adjusted by the operational amplifiers and the voltage divider resistors (R1 and R2), so that a stable VARY voltage may be output. The first operational amplifier U1 and the second operational amplifier U2 constitute an operational amplifier circuit (represented by VARY ACT), and the first transistor P1 and the second transistor N1 constitute a driving circuit (represented by VARY DRIVER).

Figure 2:
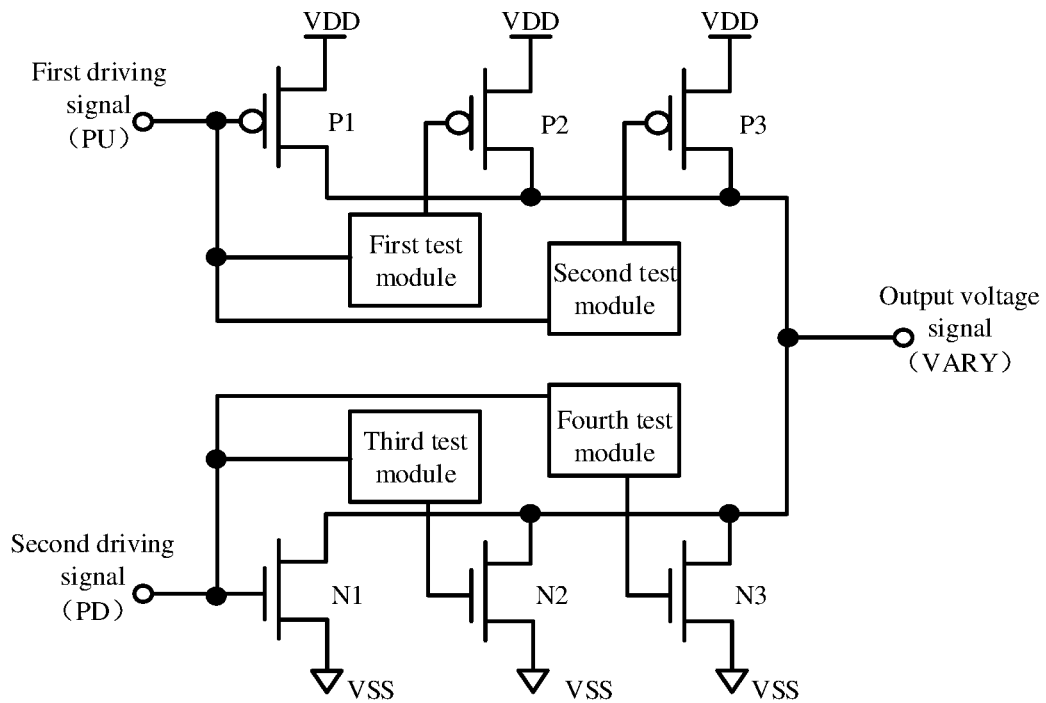
FIG. 2 is a schematic diagram of a specific circuit structure of a driving circuit.

For the driving circuit, referring to FIG. 2, FIG. 2 illustrates a schematic diagram of a specific circuit structure of a driving circuit. As shown in FIG. 2, the circuit structure may include a power supply VDD, a first P-type transistor P1, a second P-type transistor P2, a third P-type transistor P3, a first N-type transistor N1, a second N-type transistor N2, a third N-type transistor N3, a first test module (Test Mode1), a second test module (Test Mode2), a third test module (Test Mode3), and a fourth test module (Test Mode4).

Sources of the first P-type transistor P1, the second P-type transistor P2 and the third P-type transistor P3 are all connected to the power supply VDD, and sources of the first N-type transistor N1, the second N-type transistor N2 and the third N-type transistor N3 are all connected to the ground VSS. In addition, a gate of the first P-type transistor P1 is connected to a first driving signal, a gate of the second P-type transistor P2 is connected to the first test module, and a gate of the third P-type transistor P3 is connected to the second test module. A gate of the first N-type transistor N1 is connected to a second driving signal, a gate of the second N-type transistor N2 is connected to the third test module, and a gate of the third N-type transistor N3 is connected to the fourth test module. Drains of the first P-type transistor P1, the second P-type transistor P2, the third P-type transistor P3, the first N-type transistor N1, the second N-type transistor N2 and the third N-type transistor N3 are all connected to the output end to provide an output voltage signal. The first driving signal may be a Pull Up (PU) signal, the second driving signal may be a Pull Down (PD) signal, and the output voltage signal is represented by VARY.

In FIG. 2, VARY is mainly adjusted by the P-type transistors and the N-type transistors. Therefore, the more important parts in FIG. 2 are transistors P1, P2, P3 and N1, N2, N3. In addition, the four test modules (including the first test module, the second test module, the third test module and the fourth test module) are specifically used to select whether to turn on transistors P2, P3, N2 and N3 according to requirements.

Figure 3:
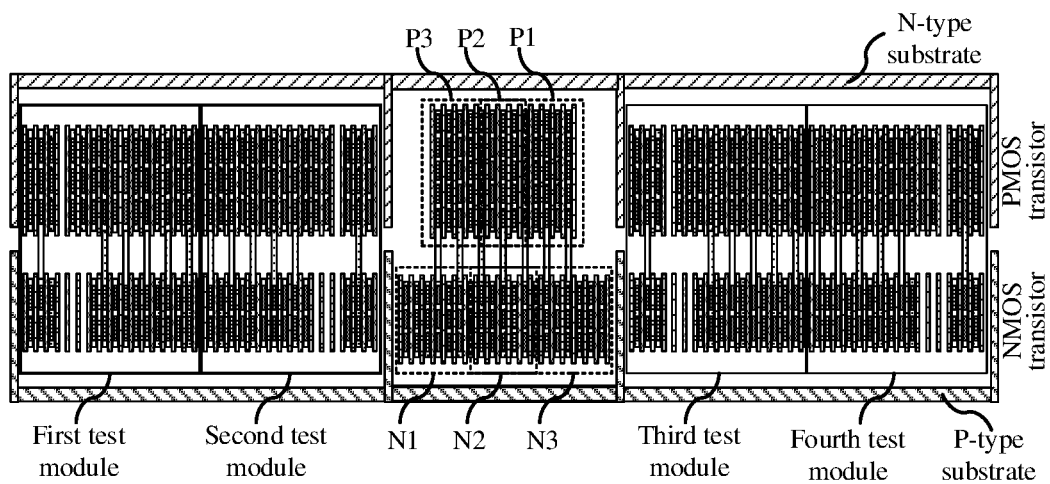
FIG. 3 is a schematic diagram of a layout structure of a driving circuit.

Based on the driving circuit illustrated in FIG. 2, FIG. 3 illustrates a schematic diagram of a layout structure of a driving circuit. As shown in FIG. 3, in the layout, the first test module, the second test module, the transistors, the third test module and the fourth test module are arranged in sequence along the horizontal direction, that is, the four test modules are distributed on both sides of the transistors. The three P-type transistors P1, P2 and P3 are arranged in an upper-lower asymmetric structure with the three N-type transistors N1, N2 and N3, edges of the N-type substrate surround the upper half of the P-type MOS transistors (referred to as "PMOS transistors" for short), and edges of the P-type substrate surround the lower half of the N-type MOS transistors (referred to as "NMOS transistors" for short). However, for the layout in FIG. 3, factors are not fully considered in the layout and routing at present, resulting in a large area and reducing the matching and consistency of signals.

Based on this, the embodiments of the present disclosure provide a layout of a driving circuit, which may include P-type transistors, N-type transistors and four test modules. The four test modules are distributed on both sides of the P-type transistors and the N-type transistors in an upper-lower symmetrical structure, and the P-type transistors and the N-type transistors have an upper-lower structure distribution in the middle of the four test modules. In this way, not only the matching and consistency of signals may be improved and the influence of external factors may be reduced, but also the area may be saved since the overall layout is in a symmetrical structure and compact arrangement.

The embodiments of the present disclosure will be described in detail below with reference to the accompanying drawings.

Figure 4:
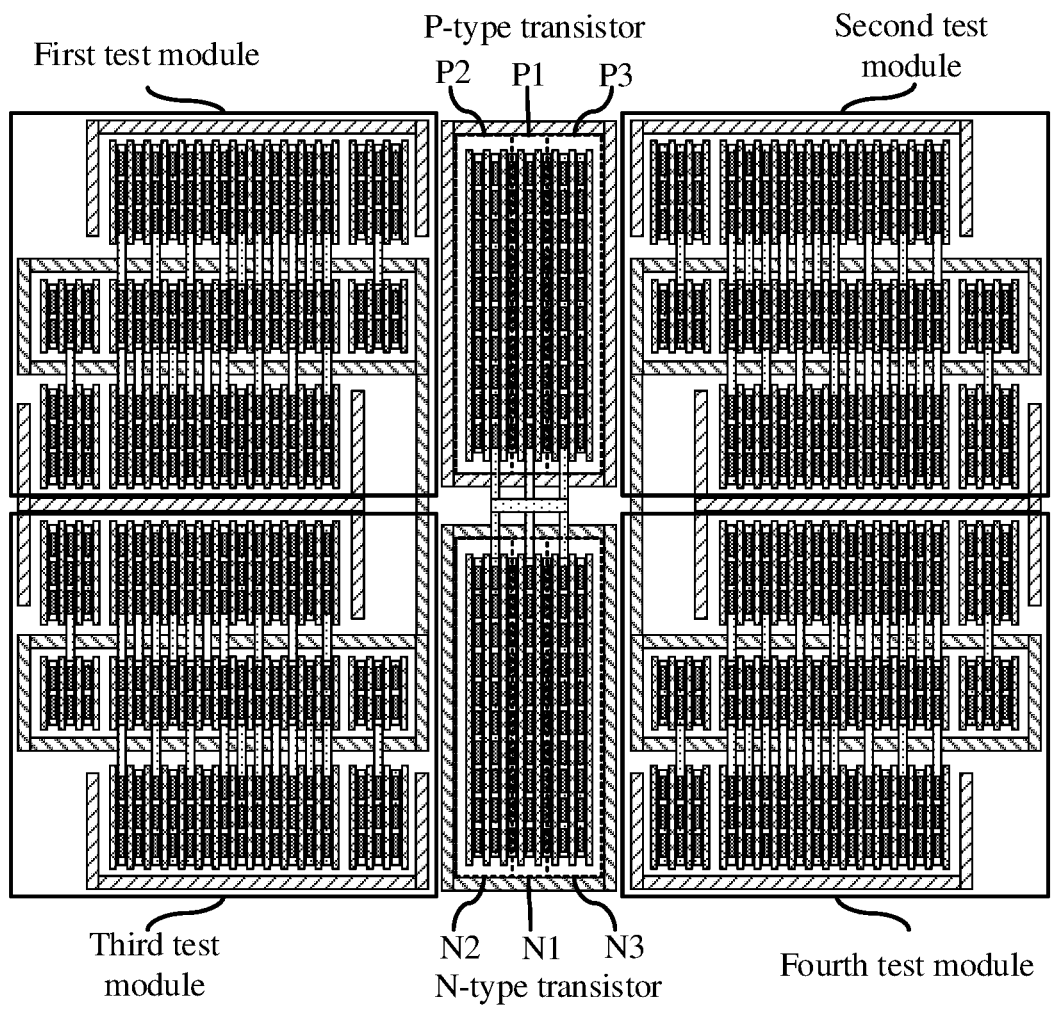
FIG. 4 is a schematic diagram of a layout structure of a driving circuit according to an embodiment of the present disclosure.

In an embodiment of the present disclosure, referring to FIG. 4, a schematic diagram of a layout structure of a driving circuit according to an embodiment of the present disclosure is illustrated. As illustrated in FIG. 4, the layout may include P-type transistors, N-type transistors and four test modules. The four test modules are distributed on both sides of the P-type transistors and the N-type transistors in an upper-lower symmetrical structure, and the P-type transistors and the N-type transistors are distributed in the middle of the four test modules in an upper-lower structure.

It is to be noted that FIG. 4 is a layout provided for the driving circuit illustrated in FIG. 2, which may also be referred to as a "layout structure". Specifically, the layout illustrated in FIG. 4 has a symmetrical structure as a whole. The four test modules distributed on both sides of the P-type transistors and the N-type transistors have the upper-lower symmetrical and left-right symmetrical structure, while the P-type transistors and N-type transistors in the middle have the upper-lower symmetrical structure.

It is also to be noted that, in the embodiments of the present disclosure, the four test modules may include a first test module, a second test module, a third test module and a fourth test module. Specifically, for these four test modules, in some embodiments, as illustrated in FIG. 4, the first test module and the second test module are distributed on both sides of the P-type transistors in a left-right symmetrical structure, and the third test module and the fourth test module are distributed on both sides of the N-type transistors in a left-right symmetrical structure.

It is also to be noted that, in the embodiments of the present disclosure, the P-type transistors include a first P-type transistor, a second P-type transistor and a third P-type transistor, and the N-type transistors include a first N-type transistor, a second N-type transistor, and a third N-type transistor. As illustrated in FIG. 4, the first P-type transistor is represented by P1, the second P-type transistor is represented by P2, the third P-type transistor is represented by P3, the first N-type transistor is represented by N1, the second N-type transistor is represented by N2, and the third N-type transistor is represented by N3.

For these transistors, a gate of the first P-type transistor is connected to a first driving signal, a gate of the second P-type transistor is connected to the first test module, and a gate of the third P-type transistor is connected to the second test module. A gate of the first N-type transistor is connected to a second driving signal, a gate of the second N-type transistor is connected to the third test module, and a gate of the third N-type transistor is connected to the fourth test module.

In the embodiments of the present disclosure, in combination with FIG. 2, the transistors P1, P2, P3, N1, N2, N3 may also be referred to as adjustment transistors since these transistors are mainly used to adjust the output voltage signal (VARY). It is to be noted that these transistors may be MOS transistors, and even may be silicon controlled rectifier and so on. Preferably, the transistors P1, P2, P3, N1, N2 and N3 described in the embodiments of the present disclosure are all MOS transistors, in which P1, P2 and P3 are P-type MOS transistors, and N1, N2 and N3 are N-type MOS transistors.

Further, in order to facilitate wiring, in some embodiments, the first P-type transistor is located between the second P-type transistor and the third P-type transistor, to enable the second P-type transistor to be close to the first test module and the third P-type transistor to be close to the second test module.

The first N-type transistor is located between the second N-type transistor and the third N-type transistor, to enable the second N-type transistor to be close to the third test module and the third N-type transistor to be close to the fourth test module.

That is, the P-type transistors and the N-type transistors are located between the four test modules, P1 is located between P2 and P3, and N1 is located between N2 and N3, such that P2, P3, N2 and N3 all are close to the test modules for ease of connection. Specifically, as illustrated in FIG. 4, P2 is close to the first test module, P3 is close to the second test module, N2 is close to the third test module, and N3 is close to the fourth test module.

Figure 5:
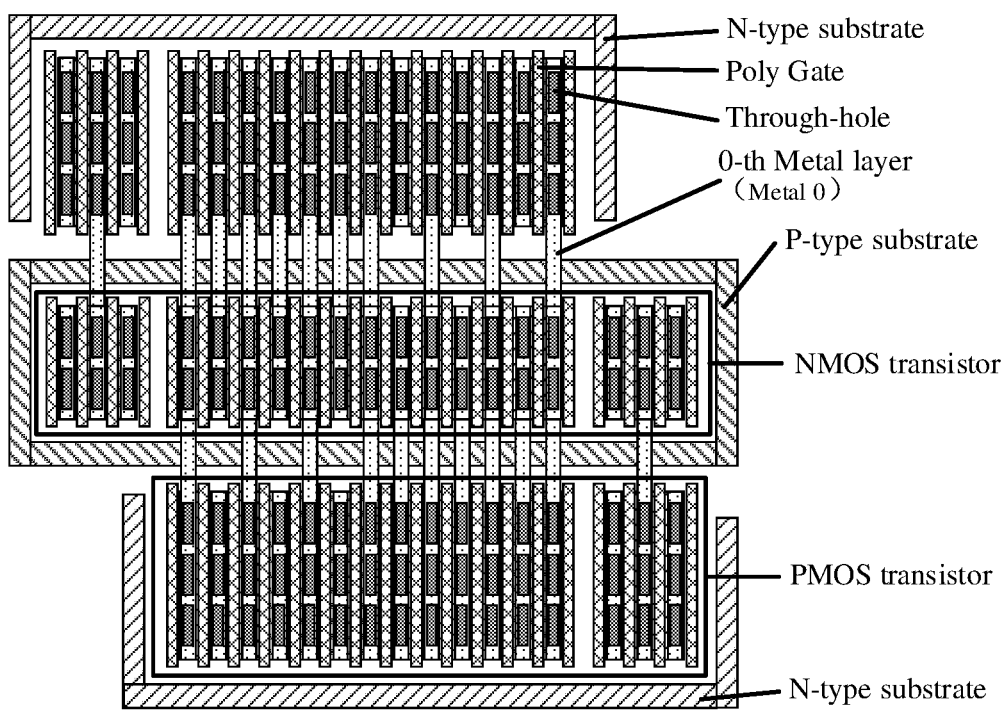
FIG. 5 is a partial enlarged schematic diagram of a layout structure of a test module according to an embodiment of the present disclosure.

In some embodiments, for each test module, referring to FIG. 5, the test module includes P-type MOS transistors and an N-type MOS transistor. The N-type MOS transistor is distributed in the middle of the test module, and the P-type MOS transistors are distributed on both sides of the N-type MOS transistor along a first direction.

It is to be noted that the P-type MOS transistor may be referred to as "PMOS transistor" for short, and the N-type MOS transistor may be referred to as "NMOS transistor" for short.

It is also to be noted that the first direction is a vertical direction. In such case, as illustrated in FIG. 5, the test module may be regarded as being composed of PMOS transistor-NMOS transistor-PMOS transistor in the vertical direction. Such distribution mainly takes into account the overall structure and wiring of the layout as well as the purpose of saving area.

Further, in some embodiments, referring to FIG. 5, the test module may also include a P-type substrate and N-type substrates. Edges of the P-type substrate surround the N-type MOS transistor, and edges of the N-type substrates surround the P-type MOS transistors, to reduce the influence between the N-type transistor and P-type transistors.

That is, in each test module, the NMOS transistor is surrounded by the edges of the P-type substrate and the PMOS transistor is surrounded by the edges of the N-type substrate. Therefore, compared with the layout of FIG. 3, the embodiments of the present disclosure add the P-type substrate and the N-type substrates, so that the influence between the transistors is reduced and the environment is cleaner.

Further, for P1, P2, P3, N1, N2, N3, in some embodiments, the first P-type transistor, the second P-type transistor, the third P-type transistor, the first N-type transistor, the second N-type transistor and the third N-type transistor are all finger structures. The finger number set in each finger structure is determined according to an overall structure and a connection distribution of the layout.

It is to be noted that finger refers to a single MOS transistor in a finger shape. The reasons for making the MOS transistor into the finger structure are that: on the one hand, based on the layout, the width-length ratio of a transistor in the analog circuit design may be very large, so it is necessary to make the transistor into the finger structure; on the other hand, based on the large width-length ratio of the transistor, the finger structure may also reduce the gate parasitic resistance; On yet other hand, in the high frequency, the noise caused by the gate resistance may also be reduced.

It is also to be noted that, in the embodiments of the present disclosure, as illustrated in FIG. 4, heights of P1, P2 and P3 correspond to the height of the first test module or the second test module, heights of N1, N2 and N3 correspond to the height of the third test module or the fourth test module, and further, each of the first test module, the second test module, the third test module and the fourth test module includes PMOS transistor-NMOS transistor-PMOS transistor. Therefore, the finger number of P1, P2, P3, N1, N2 and N3 may be adjusted to adapt to the heights of the test modules. In order to make the symmetry of the layout better, the finger number may usually be even.

That is, in the embodiments of the present disclosure, for P1, P2, P3, N1, N2, N3, the total width of each transistor=width of the single finger×the finger number. In this way, the finger number of P1, P2, P3, N1, N2 and N3 may be adjusted to adapt to the layout and wiring of the overall structure.

It is to be understood that, in the embodiments of the present disclosure, the layout is divided into a layout layer and a signal layer located above the layout layer. The first P-type transistor, the second P-type transistor, the third P-type transistor, the first N-type transistor, the second N-type transistor, the third N-type transistor and the four test modules are all located in the layout layer.

That is, FIG. 4 may be regarded as the layout layer, and FIG. 5 is a partial enlarged schematic diagram of a test module in the layout layer. As illustrated in FIG. 5, the portions filled with dense points are through-holes, the portions filled with grid lines are Poly Gates, and the portions filled with sparse points are the 0-th Metal layers.

As can be seen from FIG. 4 and FIG. 5, each transistor (such as P1, P2, P3, N1, N2, N3, PMOS transistor, NMOS transistor and so on) may include the through-holes, the Poly Gates and the 0-th metal layers. The through-holes penetrate through the 0-th metal layers, and the drains of the P-type transistor and the N-type transistor are also connected through the 0-th metal layers.

Figure 6:
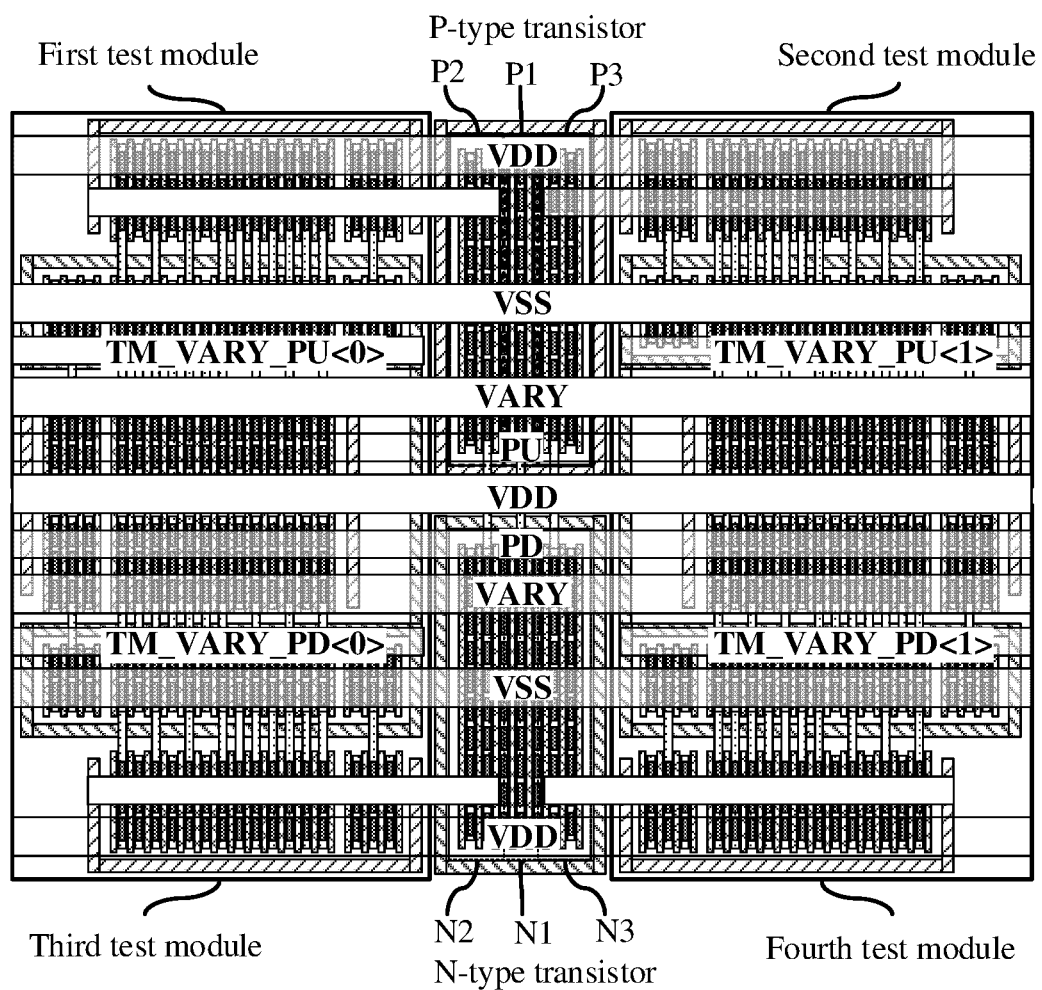
FIG. 6 is a schematic diagram of a signal layer of layout wiring according to an embodiment of the present disclosure.

Further, referring to FIG. 6, FIG. 6 illustrates a schematic diagram of a signal layer of layout wiring according to an embodiment of the present disclosure. As illustrated in FIG. 6, the signal layer may include a first driving signal, a second driving signal and an output voltage signal. The first driving signal is matched with the second driving signal and has an upper-lower structure distribution with the second driving signal, and both sides of the first driving signal and the second driving signal are distributed with the output voltage signal.

In some embodiments, referring to FIG. 6, the signal layer may also include a first test input signal, a second test input signal, a third test input signal and a fourth test input signal. The first test input signal, the second test input signal, the third test input signal and the fourth test input signal are uniformly distributed and have upper-lower symmetrical and left-right symmetrical structures.

It is to be noted that, in the embodiments of the present disclosure, the first driving signal may be represented by PU, the second driving signal may be represented by PD, the output voltage signal may be represented by VARY, the first test input signal is represented by TM_VARY_PU<0>, the second test input signal is represented by TM_VARY_PU<1>, the third test input signal is represented by TM_VARY_PD<0>, and the fourth test input signal is represented by TM_VARY_PD<1>.

It is also to be noted that, in the embodiments of the present disclosure, the first test input signal is distributed above the first test module, the second test input signal is distributed above the second test module, the third test input signal is distributed above the third test module, and the fourth test input signal is distributed above the fourth test module.

That is, FIG. 6 mainly illustrates an example of a layout of a horizontal first metal layer (Metal 1). The input signals of the test modules, i.e., TM_VARY_PU<0>, TM_VARY_PU<1>, TM_VARY_PD<0> and TM_VARY_PD<1>, are uniformly distributed and have upper-lower symmetrical and left-right symmetrical structures; and each input signal is located above the corresponding test module, for example, TM_VARY_PU<0> is located above the first test module, TM_VARY_PU<1> is located above the second test module, TM_VARY_PD<0> is located above the third test module, and TM_VARY_PD<1> is located above the fourth test module. In addition, the signal PU is matched with and the signal PD and has an upper-lower structure distribution with the signal PD, and the signal lines distributed on both sides of the signal PU and the signal PD is the power supply signal (i.e., the output voltage signal VARY). Therefore, the influence of external factors on the signals is reduced.

In addition, still taking the driving circuit of FIG. 2 as an example, for the power supply voltage signal, the power supply voltage signal is connected to a source of the first P-type transistor, a source of the second P-type transistor and a source of the third P-type transistor. The output voltage signal is connected to a drain of the first P-type transistor, a drain of the second P-type transistor, a drain of the third P-type transistor, a drain of the first N-type transistor, a drain of the second N-type transistor and a drain of the third N-type transistor. For the ground signal, the ground signal is connected to a source of the first N-type transistor, a source of the second N-type transistor and a source of the third N-type transistor.

Further, in some embodiments, referring to FIG. 6, the signal layer may also include a power supply voltage signal and a ground signal.

By taking the power supply voltage signal as a reference, the first driving signal, the output voltage signal, the first test input signal and the second test input signal, the ground signal and the power supply voltage signal are arranged in sequence in a vertical upward direction, and the second driving signal, the output voltage signal, the third test input signal and the fourth test input signal, the ground signal and the power supply voltage signal are arranged in sequence in a vertical downward direction.

It is to be noted that, in the embodiments of the present disclosure, the power supply voltage signal is represented by VDD, and the ground signal is represented by VSS. That is, by taking the VDD as a reference, PU, VARY, TM_VARY_PU<0> and TM_VARY_PU<1>, VSS and VDD are arranged in sequence in the vertical upward direction, and PD, VARY, TM_VARY_PD<0> and TM_VARY_PD<1>, VSS and VDD are arranged in sequence in the vertical downward direction. TM_VARY_PU<0> and TM_VARY_PU<1> are arranged horizontally and respectively located above the first test module and the second test module, and TM_VARY_PD<0> and TM_VARY_PD<1> are arranged horizontally and respectively located above the third test module and the third test module, so that the signals of the signal layer is distributed uniformly, the power supply capacity is sufficient and the overall structure is beautiful.

It is also to be noted that, in the embodiments of the present disclosure, Metal 0 and Metal 1 are adjacent metal layers, and may be connected through the through-holes. In addition, it is to be noted that the four unmarked signal lines in FIG. 6 are internal connections, that is, the connection between P2 and the first test module, the connection between P3 and the second test module, the connection between N2 and the third test module, and the connection between N3 and the fourth test module.

In this way, in the layout of the embodiments of the present disclosure, such as the layout layer illustrated in FIG. 4, the four test modules are respectively located all around the layout layer and have a symmetrical structure; the P-type transistors (P1, P2, P3) and the N-type transistors (N1, N2, N3) are located in the middle of the four test modules, P1 is located between P2 and P3, and N1 is located between N2 and N3, so that P2, P3, N2 and N3 are close to the corresponding test modules for easy of connection; and further, the overall layout of the layout layer has a symmetrical structure. As illustrated in the signal layer of FIG. 6, the signal layer is located above the layout layer. The input signals TM_VARY_PU<0:1> and TM_VARY_PD<0:1> of the test modules are uniformly distributed and have a symmetrical structure. In addition, the signal PU is matched with and the signal PD and has an upper-lower structure distribution with the signal PD, and the signal lines distributed on both sides of the signals PU and PD are the power supply signal. Therefore, the influence of external factors on the signals is reduced, the power supply signal is uniformly distributed, the power supply capacity is sufficient and the overall structure is beautiful.

Therefore, comparing FIG. 3 with FIG. 4, for the layout in FIG. 4, on the one hand, the overall structure of the layout is changed for easy of internal connection; on the other hand, the internal structure of each test module is changed, and meanwhile, the position of each test module is changed to be distributed beside the MOS transistor to which the test module is connected, so that the wiring is convenient and neat; on another hand, the finger numbers of P1, P2, P3 and N1, N2, N3 are changed to fit the layout and wiring of the overall structure, and the most important is that the first P-type transistor P1 and the first N-type transistor N1 connected to the signals PD and PU are arranged between P2 and P3, between N2 and N3, respectively, so that the signal lines PD and PU are more matched; on the yet hand, the overall structure of the layout of the embodiments of the present disclosure is compact arrangement, thereby saving more area, and meanwhile, the P substrate and N substrate are appropriately added, so that the influence between transistors is reduced and the environment is cleaner; moreover, the new layout also makes the distribution of the upper signal layer more symmetrical and beautiful, the matching degree of signal lines is higher, and the power supply distribution is more sufficient.

The present embodiments provide a layout of a driving circuit, which may include P-type transistors, N-type transistors and four test modules. The four test modules are distributed on both sides of the P-type transistors and the N-type transistors in an upper-lower symmetrical structure, and the P-type transistors and the N-type transistors have an upper-lower structure distribution in the middle of the four test modules. In this way, not only the matching and consistency of signals may be improved and the influence of external factors may be reduced, but also the area may be saved since the overall layout is in a symmetrical structure and compact arrangement.

Figure 7:
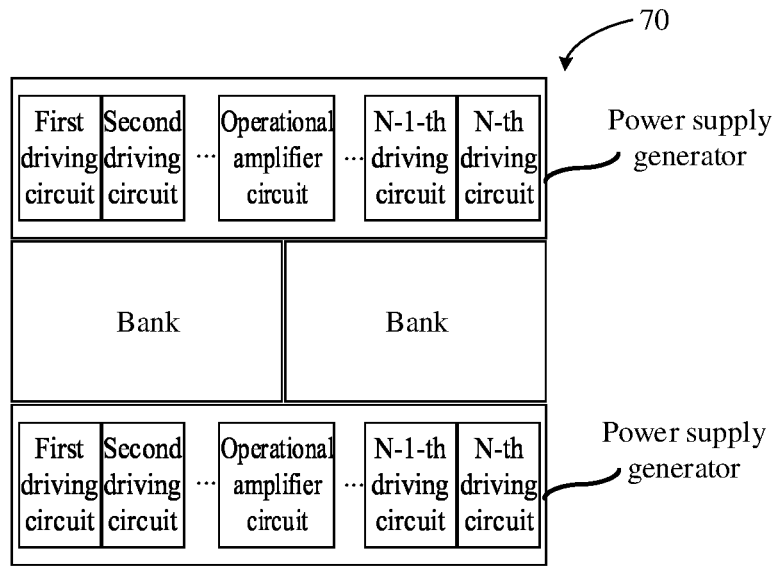
FIG. 7 is a schematic diagram of a composition of a semiconductor structure according to an embodiment of the present disclosure.

In another embodiment of the present disclosure, referring to FIG. 7, FIG. 7 illustrates a schematic diagram of a composition of a semiconductor structure according to an embodiment of the present disclosure. As illustrated in FIG. 7, the semiconductor structure 70 may include two banks and two power supply generators, the two banks are arranged along a second direction, and the two power supply generators are respectively distributed on both sides of the two banks along a first direction.

Each power supply generator is composed of N driving circuits and an operational amplifier circuit. Each of the N driving circuits corresponds to the layout as described in any one of the above embodiments, and N is an integer greater than zero.

Further, in some embodiments, for the power supply generator, the operational amplifier circuit is located in the middle of the N driving circuits.

It is to be noted that the first direction may be a vertical direction and the second direction may be a horizontal direction. As illustrated in FIG. 7, two banks are arranged along the horizontal direction, and the two power supply generators are respectively distributed on both sides of the two banks along the vertical direction.

In some embodiments, the first direction may be a horizontal direction and the second direction may be a vertical direction.

It is also to be noted that, in the embodiments of the present disclosure, a value of N may be 8. That is, each power supply generator may be composed of 8 driving circuits (VARY DRIVER) and one operational amplifier circuit (VARY ACT).

Figure 8:
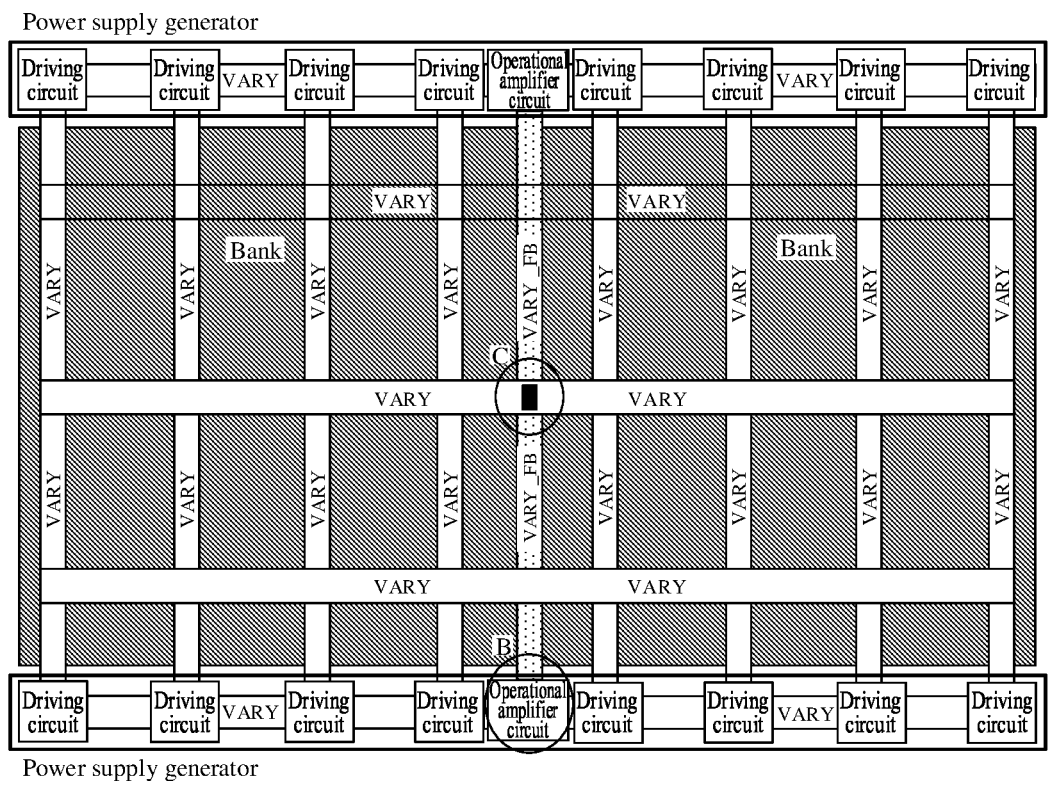
FIG. 8 is a schematic diagram of a layout of a semiconductor structure according to an embodiment of the present disclosure.

In one possible implementation, referring to FIG. 8, FIG. 8 illustrates a schematic diagram of a layout of a semiconductor structure 70 according to an embodiment of the present disclosure. As illustrated in FIG. 8, in this layout, two banks are arranged along the horizontal direction, two power supply generators are respectively distributed on both sides of the two banks along the vertical direction, and each power supply generator may include eight driving circuits and one operational amplifier circuit. In each power supply generator, the operational amplifier circuit is located in the middle of the eight driving circuits.

Further, in some embodiments, as illustrated in FIG. 8, in the layout corresponding to the semiconductor structure, output voltage signals generated by each driving circuit distributed on both sides of the layout are connected with each other and uniformly distributed in the two banks.

Further, in some embodiments, as illustrated in FIG. 8, in the layout corresponding to the semiconductor structure, output feedback signals received by each operational amplifier circuit distributed on both sides of the layout are connected, and the output feedback signals are connected with the output voltage signals at a middle position of the two banks through a contact to form a feedback circuit of the semiconductor structure.

It is to be noted that the output voltage signals generated by each driving circuit (VARY DRIVER) are represented by VARY in FIG. 8, and the output voltage signals generated by all driving circuits in the two power supply generators are connected with each other and uniformly distributed. In addition, the output feedback signal received by each operational amplifier circuit (VARY ACT) is represented by VARY_FB in FIG. 8, the output feedback signals received by the two operational amplifier circuits are connected with each other, and the output feedback signals are connected with the output voltage signals at the middle position of the two banks through a contact denoted by C to form the feedback circuit of the semiconductor structure 70.

It is also to be noted that, in FIG. 8, the specific position of the contact for the connection between the output feedback signals (VARY_FB) and the output voltage signals (VARY) is the identification position B or the identification position C, which will be described in detail with reference to FIG. 9 and FIG. 10.

Figure 9:
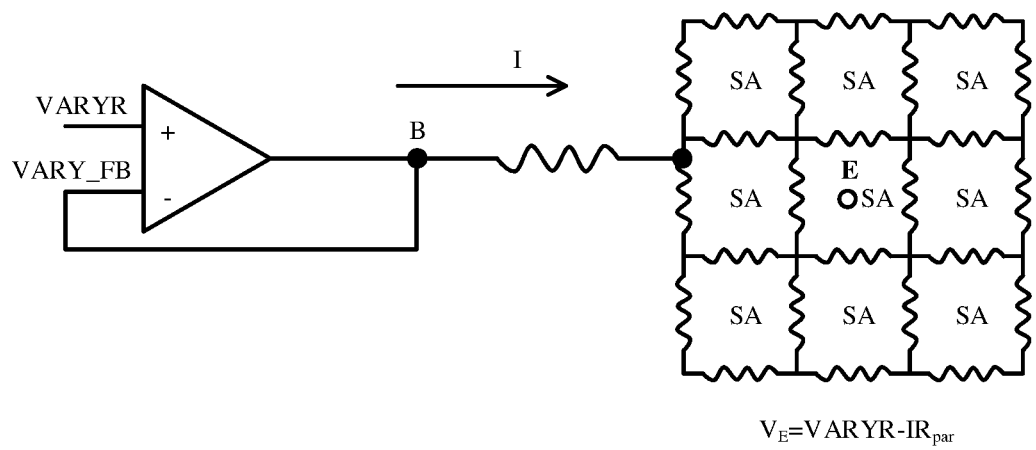
FIG. 9 is a schematic diagram of an application of a position of a contact in a feedback circuit according to an embodiment of the present disclosure.
Figure 10:
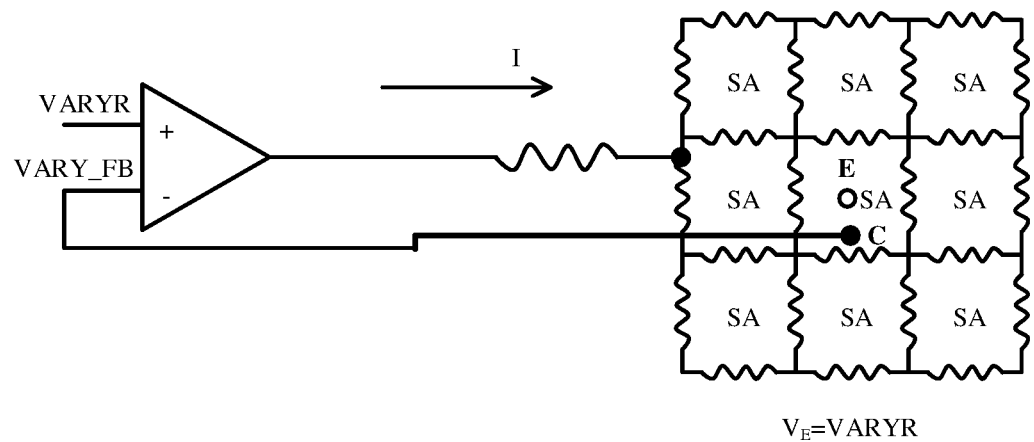
FIG. 10 is a schematic diagram of an application of a position of a contact in another feedback circuit according to an embodiment of the present disclosure.

FIG. 9 illustrates a schematic diagram of an application of a position of a contact in a feedback circuit according to an embodiment of the present disclosure, and FIG. 10 illustrates a schematic diagram of an application of a position of a contact in another feedback circuit according to an embodiment of the present disclosure. Here, the input signal is represented by VARYR and the output feedback signal is represented by VARY_FB. After passing through the operational amplifier, these two signals also pass through the VARY power supply network used for providing power to the Sense Amplifiers (SAs). In addition, the point B in FIG. 9 is equivalent to the identification position B in FIG. 8, and the point C in FIG. 10 is equivalent to the identification position C in FIG. 8. It is also to be noted that the operational amplifiers in FIG. 9 and FIG. 10 are not operational amplifiers in the actual sense, but represent the overall circuits for operational amplifying and driving (i.e., power supply generators). Moreover, the voltage divider resistors are omitted here, and the output voltage VARY is directly fed back as VARY_FB of the feedback circuit.

In the embodiments of the present disclosure, FIG. 9 and FIG. 10 are mainly used to indicate that when the contact of the VARY_FB is located in different positions in the layout, the final results of the output voltage ($V_E$) are also different. FIG. 9 illustrates that when the contact is in the identification position B, the final output voltage is $V_E$=VARYR–I×$R_{par}$. Since the distance between point B and point E is very long, I represents the current flowing through this distance, and $R_{par}$ represents the parasitic resistance caused by this distance. FIG. 10 illustrates that when the contact is in the identification position C, the final output voltage is $V_E$=VARYR. Since the distance between point C and point E is very short, the parasitic resistance caused by this distance is almost negligible. Comparing FIG. 9 with FIG. 10, it is concluded that $V_E$ obtained in FIG. 10 is more stable. Therefore, the position of the contact is preferably selected as the identification position C. In addition, $V_E$ here represents the voltage at point E, i.e., the voltage at the center point of the whole VARY power supply network.

It is also to be noted that in the layout corresponding to the semiconductor structure, taking FIG. 8 as an example, the upper and lower sides of the two banks are distributed with one power supply generator, respectively, and one power supply generator is composed of 8 driving circuits (VARY DRIVERs) and one operational amplifier circuit (VARY ACT). In addition, the VARY voltages generated by each VARY DRIVER are connected by metal lines (Metal), to ensure that the VARY power supply network has a high power (low power consumption) and is uniformly distributed in the bank. VARY ACT is located in the middle of 8 VARY DRIVERs. In addition, the generated VARY_FB are connected with each other and connected with the VARY voltages at the middle position of the two banks through one Contact to form the feedback circuit of VARY.

The present embodiment provides a semiconductor structure, which includes two banks and two power supply generators. The two banks are arranged along a second direction, and the two power supply generators are respectively distributed on both sides of the two banks along a first direction. Each power supply generator is composed of N driving circuits each corresponding to the layout as described in the above embodiments and an operational amplifier circuit, and N is an integer greater than zero. In this way, since in the layout of each driving circuit in the semiconductor structure, the four test modules are distributed on both sides of the P-type transistors and the N-type transistors in an upper-lower symmetrical structure, and the P-type transistors and the N-type transistors have an upper-lower structure distribution in the middle of the four test modules, not only the matching and consistency of signals PU and PD are improved and the influence of external factors is reduced, but also the area is saved since the overall layout is in a symmetrical structure and compact arrangement.

Figure 11:
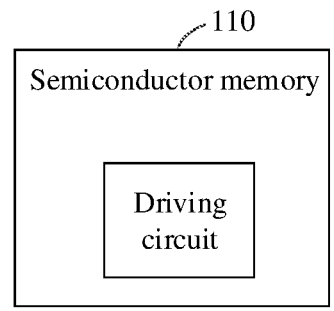
FIG. 11 is a schematic diagram of a composition structure of a semiconductor memory according to an embodiment of the present disclosure.

In another embodiment of the present disclosure, referring to FIG. 11, FIG. 11 illustrates a schematic diagram of a composition structure of a semiconductor memory according to an embodiment of the present disclosure. As illustrated in FIG. 11, the semiconductor memory 110 may include a driving circuit corresponding to the layout as described in any one of the above embodiments.

In the embodiments of the present disclosure, the semiconductor memory 110 may be a DRAM chip.

It is to be noted that in order to optimize the VARY driving performance, according to requirements, the embodiments of the present disclosure provide a layout design of a VARY driving applied to the DRAM chip, that is, the layout of the driving circuit described in the foregoing embodiments.

It is also to be noted that, for the semiconductor memory 110, in the layout of the driving circuit within the semiconductor memory, the four test modules are distributed on both sides of the P-type transistors and the N-type transistors in an upper-lower symmetrical structure, and the P-type transistors and the N-type transistors have an upper-lower structure distribution in the middle of the four test modules, such that not only the matching and consistency of signals PU and PD are improved and the influence of external factors is reduced, but also the area is saved since the overall layout is in a symmetrical structure and compact arrangement.

The above are merely the preferred embodiments of the present disclosure and are not intended to limit the scope of the present disclosure.

It should be noted that in the present disclosure, terms "include" and "contain" or any other variation thereof are intended to cover nonexclusive inclusions, so that a process, method, object or device including a series of elements not only includes those elements but also includes other elements which are not clearly listed or further includes elements intrinsic to the process, the method, the object or the device. Under the condition of no more limitations, an element defined by the statement "including a/an . . . " does not exclude existence of the same other elements in a process, method, object or device including the element.

The sequence numbers of the embodiments of the disclosure are adopted not to represent superiority-inferiority of the embodiments but only for description.

The methods disclosed in some method embodiments provided in the disclosure may be freely combined without conflicts to obtain new method embodiments.

The features disclosed in some product embodiments provided in the disclosure may be freely combined without conflicts to obtain new product embodiments.

The features disclosed in some method or device embodiments provided in the disclosure may be freely combined without conflicts to obtain new method embodiments or device embodiments.

The above is only the specific implementation of the disclosure and not intended to limit the scope of protection of the disclosure. Any variations or replacements apparent to those skilled in the art within the technical scope disclosed by the disclosure shall fall within the scope of protection of the disclosure. Therefore, the scope of protection of the disclosure shall be subject to the scope of protection of the claims.

The embodiments of the disclosure provide a layout of a driving circuit, a semiconductor structure and a semiconductor memory. The layout may include P-type transistors, N-type transistors and four test modules. The four test modules are distributed on both sides of the P-type transistors and the N-type transistors in an upper-lower symmetrical structure, and the P-type transistors and the N-type transistors have an upper-lower structure distribution in the middle of the four test modules. In this way, not only the matching and consistency of signals may be improved and the influence of external factors may be reduced, but also the area may be saved since the overall layout is in a symmetrical structure and compact arrangement.

The invention claimed is:

1. A layout of a driving circuit, comprising: P-type transistors, N-type transistors and four test modules, wherein the four test modules are distributed on both sides of the P-type transistors and the N-type transistors in an upper-lower symmetrical structure, and the P-type transistors and the N-type transistors have an upper-lower structure distribution in the middle of the four test modules.

2. The layout of claim 1, wherein the four test modules comprise a first test module, a second test module, a third test module and a fourth test module; wherein
the first test module and the second test module are distributed on both sides of the P-type transistors in a symmetrical structure, and the third test module and the fourth test module are distributed on both sides of the N-type transistors in a symmetrical structure.

3. The layout of claim 2, wherein the P-type transistors comprise a first P-type transistor, a second P-type transistor and a third P-type transistor, and the N-type transistors comprise a first N-type transistor, a second N-type transistor and a third N-type transistor; wherein
a gate of the first P-type transistor is connected to a first driving signal, a gate of the second P-type transistor is connected to the first test module, and a gate of the third P-type transistor is connected to the second test module; and
a gate of the first N-type transistor is connected to a second driving signal, a gate of the second N-type transistor is connected to the third test module, and a gate of the third N-type transistor is connected to the fourth test module.

4. The layout of claim 3, wherein the first P-type transistor is located between the second P-type transistor and the third P-type transistor, to enable the second P-type transistor to be close to the first test module and the third P-type transistor to be close to the second test module; and
the first N-type transistor is located between the second N-type transistor and the third N-type transistor, to enable the second N-type transistor to be close to the third test module and the third N-type transistor to be close to the fourth test module.

5. The layout of claim 3, wherein the first P-type transistor, the second P-type transistor, the third P-type transistor, the first N-type transistor, the second N-type transistor and the third N-type transistor are all finger structures; and
wherein a number of fingers set in each of the finger structures is determined according to an overall structure and a connection distribution of the layout.

6. The layout of claim 1, wherein each of the test modules comprises P-type Metal Oxide Semiconductor (MOS) transistors and an N-type MOS transistor, wherein the N-type MOS transistor is distributed in the middle of the test module, and the P-type MOS transistors are distributed on both sides of the N-type MOS transistor along a first direction.

7. The layout of claim 6, wherein the test module further comprises a P-type substrate and N-type substrates, wherein edges of the P-type substrate surround the N-type MOS transistor, and edges of the N-type substrates surround the P-type MOS transistors.

8. The layout of claim 3, wherein the layout is divided into a layout layer and a signal layer located above the layout layer; and
wherein the first P-type transistor, the second P-type transistor, the third P-type transistor, the first N-type transistor, the second N-type transistor, the third N-type transistor and the four test modules are all located in the layout layer.

9. The layout of claim 8, wherein the signal layer comprises the first driving signal, the second driving signal and an output voltage signal;
wherein the first driving signal is matched with the second driving signal and has an upper-lower structure distribution with the second driving signal, and both sides of the first driving signal and the second driving signal are distributed with the output voltage signal.

10. The layout of claim 9, wherein the signal layer further comprises a first test input signal, a second test input signal, a third test input signal and a fourth test input signal; and
wherein the first test input signal, the second test input signal, the third test input signal and the fourth test input signal are uniformly distributed and have upper-lower symmetrical and left-right symmetrical structures.

11. The layout of claim 10, wherein the first test input signal is distributed above the first test module, the second test input signal is distributed above the second test module, the third test input signal is distributed above the third test module, and the fourth test input signal is distributed above the fourth test module.

12. The layout of claim 11, wherein the signal layer further comprises a power supply voltage signal and a ground signal; wherein
by taking the power supply voltage signal as a reference, the first driving signal, the output voltage signal, the first test input signal and the second test input signal, the ground signal and the power supply voltage signal are arranged in sequence in a vertical upward direction, and the second driving signal, the output voltage signal, the third test input signal and the fourth test input signal, the ground signal and the power supply voltage signal are arranged in sequence in a vertical downward direction.

13. The layout of claim 12, wherein:
the power supply voltage signal is connected to a source of the first P-type transistor, a source of the second P-type transistor and a source of the third P-type transistor;
the output voltage signal is connected to a drain of the first P-type transistor, a drain of the second P-type transistor, a drain of the third P-type transistor, a drain of the first N-type transistor, a drain of the second N-type transistor and a drain of the third N-type transistor; and
the ground signal is connected to a source of the first N-type transistor, a source of the second N-type transistor and a source of the third N-type transistor.

14. A semiconductor structure, comprising: two banks and two power supply generators, the two banks being arranged along a second direction, and the two power supply generators being respectively distributed on both sides of the two banks along a first direction;
wherein each power supply generator comprises N driving circuits and an operational amplifier circuit, N being an integer greater than zero and each of the N driving circuits corresponding to a layout, the layout comprising:
P-type transistors, N-type transistors and four test modules, wherein the four test modules are distributed on both sides of the P-type transistors and the N-type transistors in an upper-lower symmetrical structure, and the P-type transistors and the N-type transistors have an upper-lower structure distribution in the middle of the four test modules.

15. The semiconductor structure of claim 14, wherein the operational amplifier circuit in the power supply generator is located in the middle of the N driving circuits.

16. The semiconductor structure of claim 14, wherein a value of N is 8.

17. The semiconductor structure of claim 14, wherein, in a layout corresponding to the semiconductor structure, output voltage signals generated by each driving circuit distributed on both sides of the layout are connected with each other and uniformly distributed in the two banks.

18. The semiconductor structure of claim 17, wherein, in the layout corresponding to the semiconductor structure, output feedback signals received by each operational amplifier circuit distributed on both sides of the layout are connected, and the output feedback signals are connected with the output voltage signals at a middle position of the two banks through a contact to form a feedback circuit of the semiconductor structure.

19. A semiconductor memory, comprising: a driving circuit corresponding to a layout, wherein the layout comprises:
   P-type transistors, N-type transistors and four test modules, wherein the four test modules are distributed on both sides of the P-type transistors and the N-type transistors in an upper-lower symmetrical structure, and the P-type transistors and the N-type transistors have an upper-lower structure distribution in the middle of the four test modules.

20. The semiconductor memory of claim 19, wherein the semiconductor memory is a Dynamic Random Access Memory (DRAM) chip.

* * * * *